US006737933B2

(12) United States Patent
Nyberg

(10) Patent No.: US 6,737,933 B2
(45) Date of Patent: May 18, 2004

(54) CIRCUIT TOPOLOGY FOR ATTENUATOR AND SWITCH CIRCUITS

(75) Inventor: Petri Nyberg, Helsinki (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/047,017

(22) Filed: Jan. 15, 2002

(65) Prior Publication Data

US 2003/0132814 A1 Jul. 17, 2003

(51) Int. Cl.[7] .................................... H03H 11/24
(52) U.S. Cl. .............................. 333/81 R; 333/23
(58) Field of Search ........................ 333/23, 81 R, 333/81 A; 330/54

(56) References Cited

U.S. PATENT DOCUMENTS 4,837,530 A 6/1989 Kondoh
4,845,446 A 7/1989 Roth ........................ 333/81
4,970,478 A * 11/1990 Townley ................ 333/81 R
4,978,932 A 12/1990 Gupta et al. ............... 333/81
5,049,841 A 9/1991 Cooper et al. ............. 333/81
5,157,323 A 10/1992 Ali et al. .................. 333/81
5,440,280 A 8/1995 Lord ........................ 333/81
5,563,557 A 10/1996 Sasaki ...................... 333/81
5,648,740 A 7/1997 Devlin et al. ............ 327/408
5,666,089 A 9/1997 Ehlers ...................... 333/81
5,909,641 A 6/1999 Simmons
5,912,599 A 6/1999 Beall ........................ 333/81
5,969,500 A 10/1999 Ishikawa et al. ......... 327/308
5,990,580 A * 11/1999 Weigand .................. 307/125
6,049,250 A * 4/2000 Kintis et al. .............. 330/54

OTHER PUBLICATIONS

Data Sheet for Agilent, HMMC–1015 DC–50 GHz Variable Attenuator.
Data Sheet for Alpha, 18–50 GHz GzAs MMIC Voltage Variable Attenuator, AC850M1–00.
Data Sheet for Alpha, 18–50 GHz GaAs MMIC Voltage Variable Attenuator; A V850 M2–00.
Data Sheet for Caswell Technology, 6 Bit Digital Attenuator, 0.5–16GHz; P35–4307–000–200.
Data Sheet for Caswell Technology, 5 Bit Digital Attenuator DC–16 GHz; P35–4304–000–200.
Data Sheet for Caswell Technology, Single Bit Absorptive Step Attenuator, DC–20GHz; P35–4235–000–200.
Data Sheet for Triquint, Digital Attenuator; 6425.
Data Sheet for UMS, DC–40GHz Attenuator, GaAs Monolithic Microwave IC; CHT3091a.
Data Sheet for Caswell Technology, GaAs MMIC SPST Absorptive Switch, DC 20GHz; P35–4235–000–200.

* cited by examiner

*Primary Examiner*—Robert Pascal
*Assistant Examiner*—Dean Takaoka
(74) *Attorney, Agent, or Firm*—Cohen, Pontani, Lieberman & Pavane

(57) ABSTRACT

An attenuator for radio frequency applications includes variable shunt elements and series transmission elements. The impedances of the variable shunt elements and the series transmission elements are selected so that the impedance of the attenuator at the input terminal remains at a nominal value for all attenuation levels, thereby producing low loss at high frequencies. The use of the attenuator as a switch yields a non-reflective switch at radio frequencies.

26 Claims, 7 Drawing Sheets

CIRCUIT TOPOLOGY FOR ATTENUATOR AND SWITCH CIRCUITS

BACKGROUND OF THE INVENTION

1. Field of the Invention

The present invention relates to a circuit topology for attenuator and switch circuits having low loss at radio frequencies.

2. Description of the Related Art

Known attenuator circuits are designed using "T" or "Pi" resistive network topologies or configurations. The "T" resistive network configuration includes two variable series elements and a variable shunt element connected between the series elements. The "Pi" resistive network configuration includes two variable shunt elements and a variable series element connected between the two shunt elements. In both types of network configurations, a first control signal is connected to the shunt element(s) and a second control signal is connected to the series element(s). While the shunt element(s) control the majority of attenuation in "T" type attenuators, the series element(s) control the impedance of the circuit.

For example, FIG. 1 shows a prior art attenuator 100 having a "T" resistive network configuration with variable series resistors R1' and R3' and a variable shunt resistor R2'. In this device, the minimum attenuation state is achieved when the variable series resistors R1' and R3' are at a minimum resistance value and the variable shunt resistor R2' is at a maximum resistance value. Attenuation is initiated by decreasing the variable shunt resistor R2' via a control signal CTRL2' and increasing the variable series resistors R1' and R3' via a control signal CTRL1'. Variable series resistances R1' and R3' ensure that the attenuator matches the impedance of the circuits connected to the input and the output while variable shunt resistance R2' ensures proper attenuation.

In digital attenuators, only the full ON and full OFF states of the variable elements are used. In these digital circuits, the variable shunt and series elements typically comprise FETs. The width of the gate for the series FETs is chosen to be wide enough to achieve a low insertion loss at the minimum attenuation level. However, this increased width causes an increase in the parasitic capacitance of the device, which causes an impedance mismatch at relatively high frequencies such as radio frequencies.

SUMMARY OF THE INVENTION

An object of the present invention is to provide a circuit for attenuation of radio frequency signals that does not introduce parasitic capacitance that limits the dynamic range and that has a low insertion loss.

According to an embodiment of the present invention, an attenuator includes only variable shunt elements. That is, the attenuator according to the present invention does not include variable series elements. Instead, series transmission lines are connected with the variable shunt elements. The impedances of the variable shunt elements and series transmission lines are designed so that the impedance of the attenuator at the input and output terminals is maintained at a nominal level for all levels of attenuation. According to the present invention, the transmission line is an inductive transmission line that is coupled with the capacitance of the variable shunt elements to produce the desired impedance.

According to a further embodiment of the present invention, each of the variable series elements of a known attenuator topology such as the "Pi" or "T" resistive network topologies is replaced by a variable shunt element and a series transmission line. As in the embodiment described above, the impedances of the variable shunt elements and series transmission lines are designed so that the nominal impedance of the attenuator is maintained for all attenuation levels.

The variable shunt elements may comprise Field Effect Transistors (FETs), PIN-diodes, and/or Bipolar Junction Transistors (BJTs). FETs operable at radio frequencies include metal semiconductor FETs (MESFETs), high electron mobility transistors (HEMTs), and pseudo-morphic HEMTs (pHEMTs). BJTs operable at radio frequencies include Heterojunction Bipolar Transistors.

The inventive attenuator circuit may be used in digital attenuation circuits, variable attenuator circuits and switches.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims.

BRIEF DESCRIPTION OF THE DRAWINGS

In the drawings, wherein like reference characters denote similar elements throughout the several views.

DETAILED DESCRIPTION OF THE PRESENTLY PREFERRED EMBODIMENTS

Figure 2:
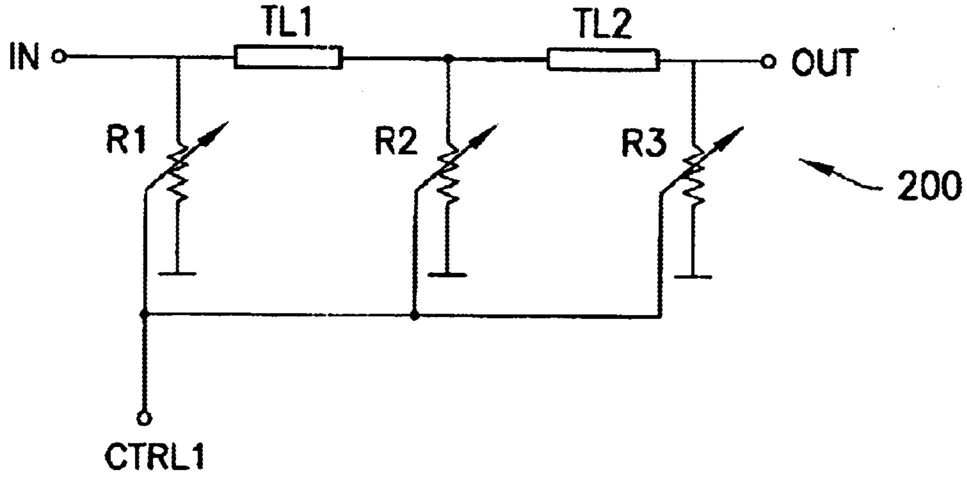
FIG. 2 is a schematic diagram of an attenuator circuit according to an embodiment of the present invention.

A low-loss attenuator circuit 200 according to the present invention is shown in FIG. 2. The circuit 200 includes first and second transmission lines TL1, TL2 connected in series between an input terminal IN and an output terminal OUT. The circuit 200 further includes three variable shunt elements R1, R2, R3 connected to ground. The first variable shunt element R1 is connected between the input terminal IN and the first transmission line TL1, the second variable shunt element R2 is connected between the first and second transmission lines TL1, TL2, and the third variable shunt element R3 is connected between the second transmission line TL2 and the output terminal OUT. The impedance of each of the three shunt elements R1, R2, R3 is controlled by a single control signal CTRL1.

To attain minimum attenuation, each of the three shunt elements R1, R2, R3 is at a high resistance. Attenuation of an input signal is achieved by adjusting the control signal CTRL1 to lower the resistance of the second variable element R2 and thereby shunt the input signal to ground. The resistance of the first and third variable shunt elements R1, R3 is simultaneously lowered by the adjustment of the control voltage CTRL1. However, the impedances of the transmission lines TL1 and TL2 with the first and third variable shunt elements R1, R3 are designed so that the impedances of the circuit 200 at the input terminal IN and the output terminal OUT are maintained within an operable range for all attenuation levels of the circuit 200. Thus, the impedance of circuit 200 at the input terminal IN is always within the operable range for the circuit connected to the input terminal IN and the impedance of circuit 200 at the output terminal OUT is within the operable range for the circuit connected to the output terminal OUT. The operable range may, for example, be the range corresponding to the acceptable return loss for a particular application. The return loss is a measure of the dissimilarity between two impedances and is expressed by the following formula:

$$\text{Return Loss}=-20\log|(ZL-Z0)/(ZL+Z0)|,$$

where,

ZL is the actual impedance of the circuit;

Z0 is the nominal impedance level of the circuit.

The return loss is a ratio of the incident power to the reflected power. Since the goal of impedance matching is to limit the reflected power, a higher return loss indicates a better impedance match. For typical applications, a return loss of 10 dB or greater is acceptable.

Figure 1:
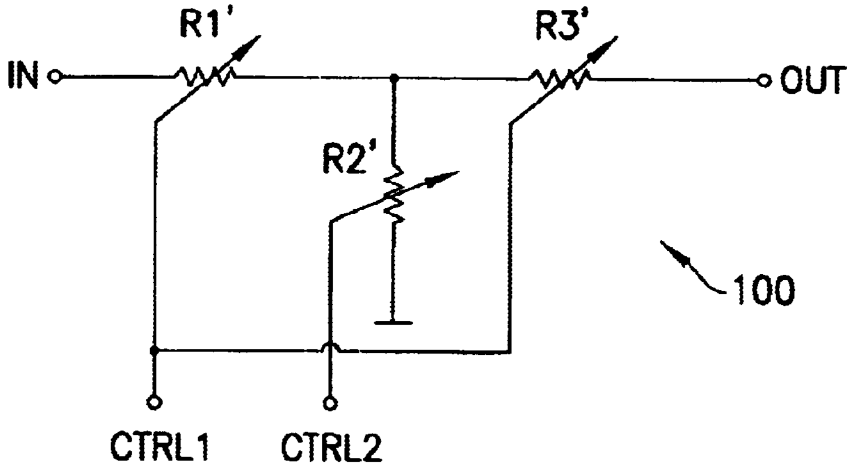
FIG. 1 PRIOR ART
FIG. 1 is a schematic diagram of a prior art attenuator circuit.

The three variable elements in circuit 200 correspond to the three variable elements in the prior art circuit 100 of FIG. 1. However, circuit 200 includes first variable shunt element R1 and first series transmission line TL1 instead of the series variable elements R1' and includes third variable shunt element R3 and second series transmission element TL2 instead of the variable series element R3'. Accordingly, all of the variable elements of circuit 200 are shunt elements.

Figure 3:
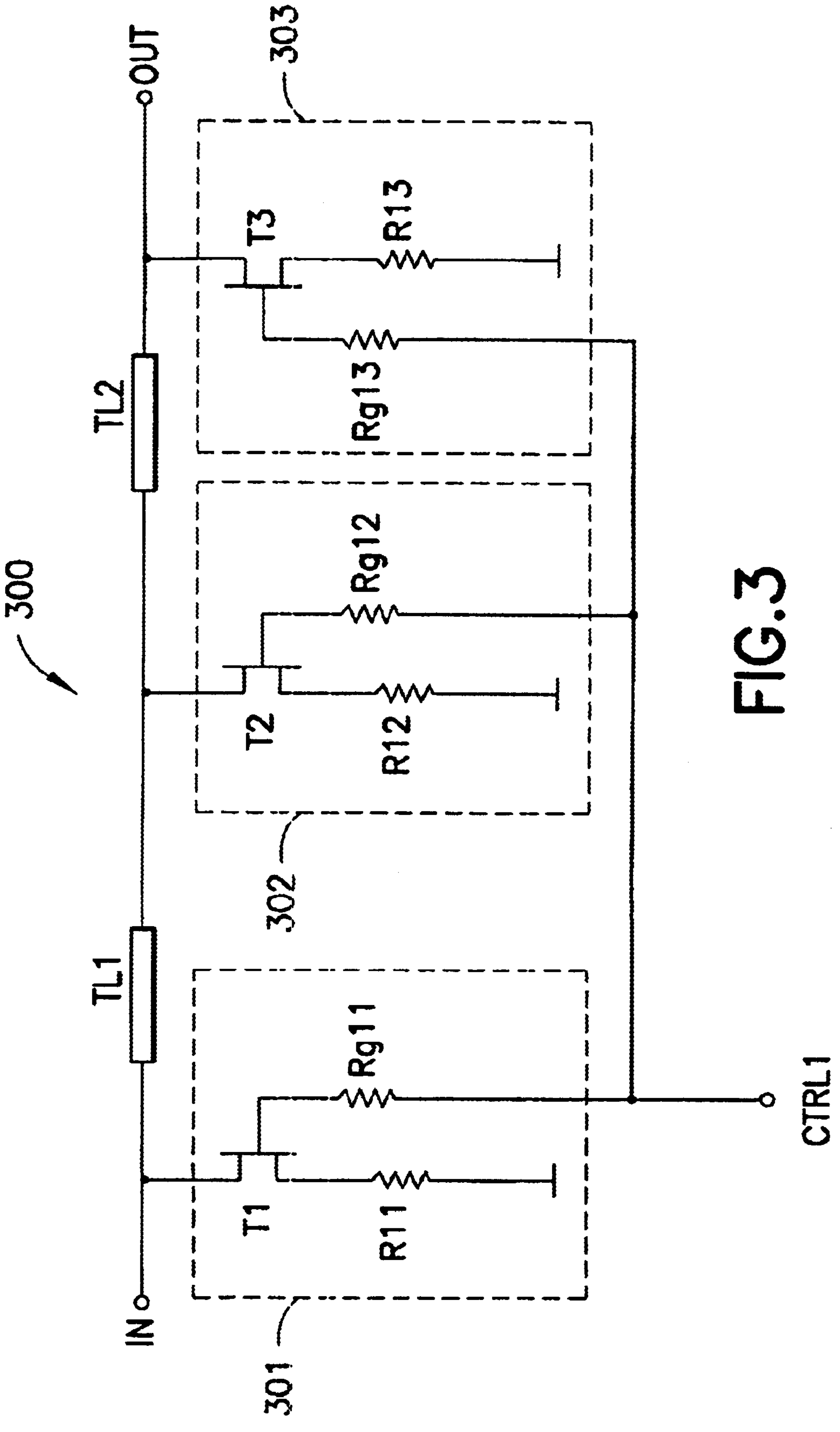
FIG. 3 is a practical implementation of the circuit of FIG. 2.

FIG. 3 is a schematic diagram of a circuit 300 which is a practical implementation of the circuit of FIG. 2. Circuit 300 includes variable shunt elements 301, 302, 303 respectively comprising transistors T1, T2, T3 connected in series with resistors R11, R12, R13. A gate of each transistor T1, T2, T3 is respectively connected to the control voltage CTRL1 via gate resistors Rg11, Rg12, Rg13. The transistors T1, T2, T3 by way of example are depicted as Field Effect Transistors (FETs). Types of FETs which may be used at radio frequencies include metal semiconductor field effect transistors (MESFETs), high electron mobility transistors (HEMTs), and pseudo morphic HEMTs (pHEMTs). As an alternative, the transistors T1, T2, T3 may comprise bipolar junction transistors such as heterojunction bipolar transistors (HBTs) or PIN-diodes instead of FETs. The transmission lines TL1, TL2 comprise inductive reactances and may, for example, comprise deposited thin film metal lines. Each transmission line may comprise either a single thin film metal line or a plurality of thin film metal lines to achieve the desired impedance.

Like the variable shunt elements R1, R2, R3 in the circuit 200 of FIG. 2, each transistor T1, T2, T3 in FIG. 3 is controlled via a control signal CTRL1. In the preferred embodiment, the control signal CTRL1 is a control voltage. Alternatively, circuit 300 may be arranged so that the variable shunt elements 301, 302, 303 are controlled via a control current. The type of control signal (voltage or current) is in any event a matter of design choice.

In FIG. 3, the gates of the transistors T1, T2, T3 are connected to the control signal CTRL1 to selectively attenuate the input signal. Control signal CTRL1 may comprise a continuously variable voltage control or the circuit 200 may also be controlled as a digital attenuator in which the transistors T1, T2, T3 are selectively controlled in either an ON state or an OFF state by the control signal CTRL1. When the transistor T2 is in an ON state, the input signal received at the input terminal INPUT is shunted to ground and the input signal is attenuated. At the same time, transistors T1 and T3 are also controlled via the control signal CTRL1 and are designed so that the impedance at the input IN and the output OUT remain within their respective operable ranges for all attenuation levels. This impedance matching is accomplished by properly designing the impedances of the transmission lines TL1, TL2 and the transistors T1, T3 so that the resulting impedances at the input terminal and the output terminal remain within their respective operable ranges at all attenuation levels.

Figure 4A:
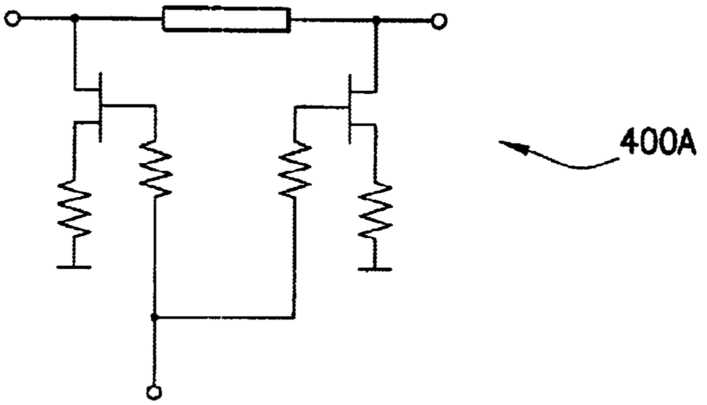
FIGS. 4A and 4B are schematic diagrams of attenuator circuits having more and less attenuation than the attenuation circuit of FIG. 3.
Figure 4B:
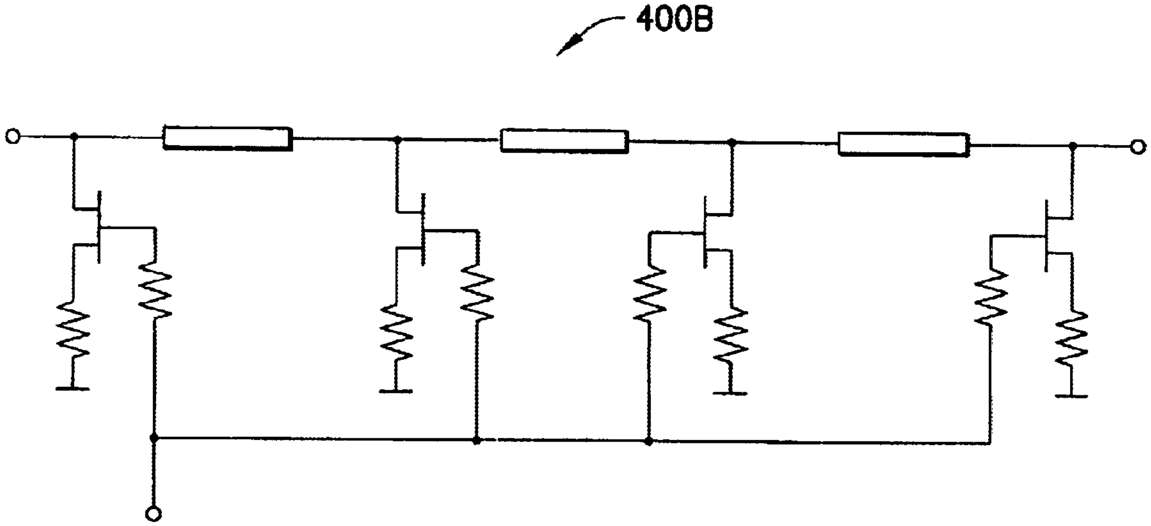

The inventive circuit topology may be used in attenuator cells that provide more or less attenuation than that of the attenuation circuit 300 of FIG. 3. For example, FIG. 4A shows an attenuator circuit 400A providing less attenuation and FIG. 4B shows an attenuator circuit 400B providing more attenuation than the circuit 300.

The attenuation circuits 300, 400A, and 400B exhibit an Amplitude Modulation (AM)/AM conversion characteristic that is opposite to the AM/AM conversion characteristic of power amplifiers. Accordingly, these circuits may be used as a predistorter connected in series with a power amplifier to correct the detrimental AM/AM conversion characteristics of the amplifier. More specifically, the power amplifier typically has a nonlinear characteristic referred to as gain compression in which a desired amplitude change of 10 dB exhibits itself as only a 9 dB change at a high input signal. The AM/AM conversion characteristic of the attenuation circuits 300, 400A, and 400B has been found to exhibit a gain expansion characteristic in which the gain in dB increases at high input signal levels. By appropriate design, the gain expansion characteristic of the attenuation circuit cancels the gain compression characteristic of the amplifier. Since the non-linearity of the amplifier may be corrected, a cheaper amplifier may be used with the attenuation circuit instead of a more expensive linear amplifier. Furthermore, the attenuation circuit of the present invention corrects the linearity of the amplifier output, thereby allowing an increase in the maximum linear output power level of an amplifier.

Figure 5:
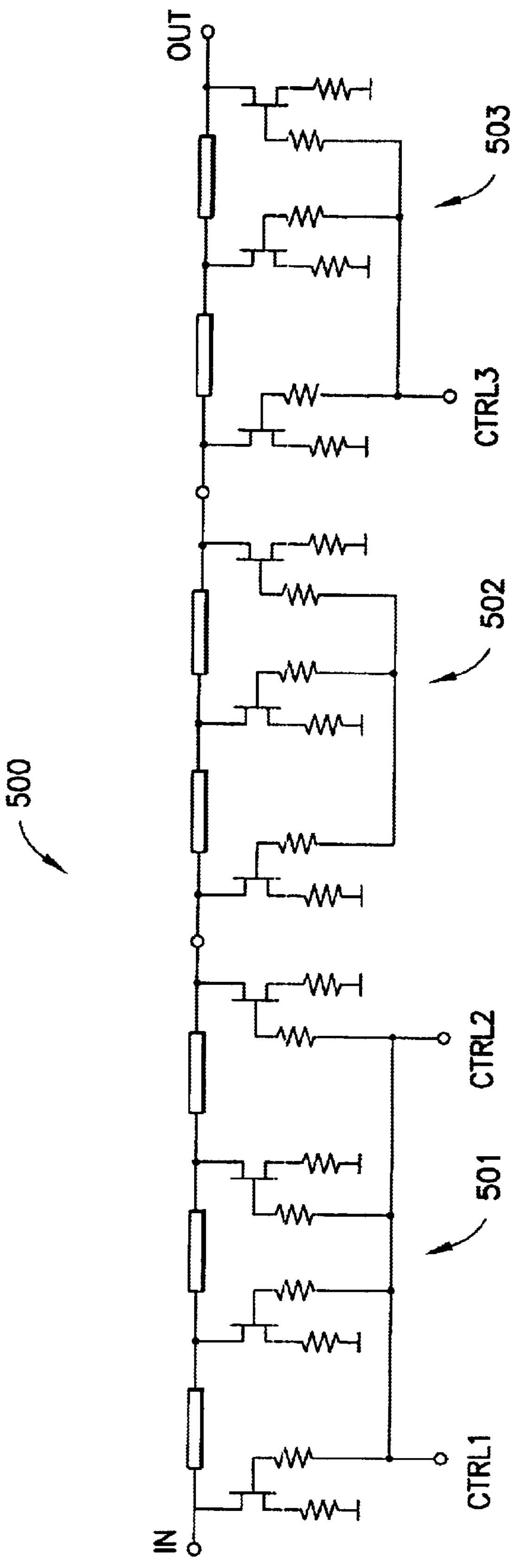
FIG. 5 is a schematic diagram of a three-bit digital attenuator according to an embodiment of the present invention.

The attenuation circuit 300 of FIG. 3 may be implemented as a portion of a larger attenuation circuit such as the three-bit digital attenuator 500 shown in FIG. 5. The three-bit digital attenuator 500 includes three attenuation circuits 501, 502, 503 connected in series. In the present example, the first circuit 501 is a 20 dB attenuator, the second circuit 502 is a 10 dB attenuator, and the third circuit 503 is a 5 dB attenuator. Each attenuator circuit is selectively turned on and off to achieve composite attenuations by the attenuator 500 of 0, 5, 10, 15, 20, 25, 30, and 35 dB. For example, if the second and third attenuator circuits 502, 503 are in the attenuating state and the first attenuator circuit 501 is in the non-attenuating state then an attenuation of 15 dB results, and if the first and third attenuating circuits 501, 503 are in the attenuating state and the second attenuator circuit 502 is in the non-attenuating state then an attenuation of 25 dB results.

The three-bit digital attenuator 500 may also be used as a voltage variable attenuator if the control signals CTRL1, CTRL2, and CTRL3 are continuously controlled, thereby providing any attenuation value between the minimum and maximum attenuation values. In one embodiment, each of the control signals CTRL1, CTRL2, and CTRL3 are tied together so that the entire circuit is controlled by one control signal. In another embodiment, the attenuator circuits 501, 502, and 503 are controlled sequentially. Using the above example, in which the first circuit 501 is a 20 dB attenuator, the second circuit 502 is a 10 dB attenuator, and the third circuit 503 is a 5 dB attenuator, the sequential control of the three-bit digital attenuator may be performed as follows: (1) the third circuit 503 is first controlled to reach the required attenuation, (2) if the required attenuation is more than 5 dB, then the third attenuation circuit 503 is controlled to its maximum setting and the second circuit 502 is controlled to reach the required attenuation, and (3) if the required attenuation is more than 15 dB, the third and second attenuation circuits are set to maximum attenuation and the first circuit is adjusted to meet the required attenuation. Therefore, if 11 dB attenuation is required, the third attenuation circuit 503 is set to 5 dB, the second attenuation circuit 502 is set to 6 dB, and the first attenuation circuit 501 is set to 0 dB. If 18 dB attenuation is required, the third and second attenuation circuits 503, 502 are controlled to maximum attenuation of 5 dB and 10 dB respectively, and the first circuit is controlled to 3 dB.

Figure 6:
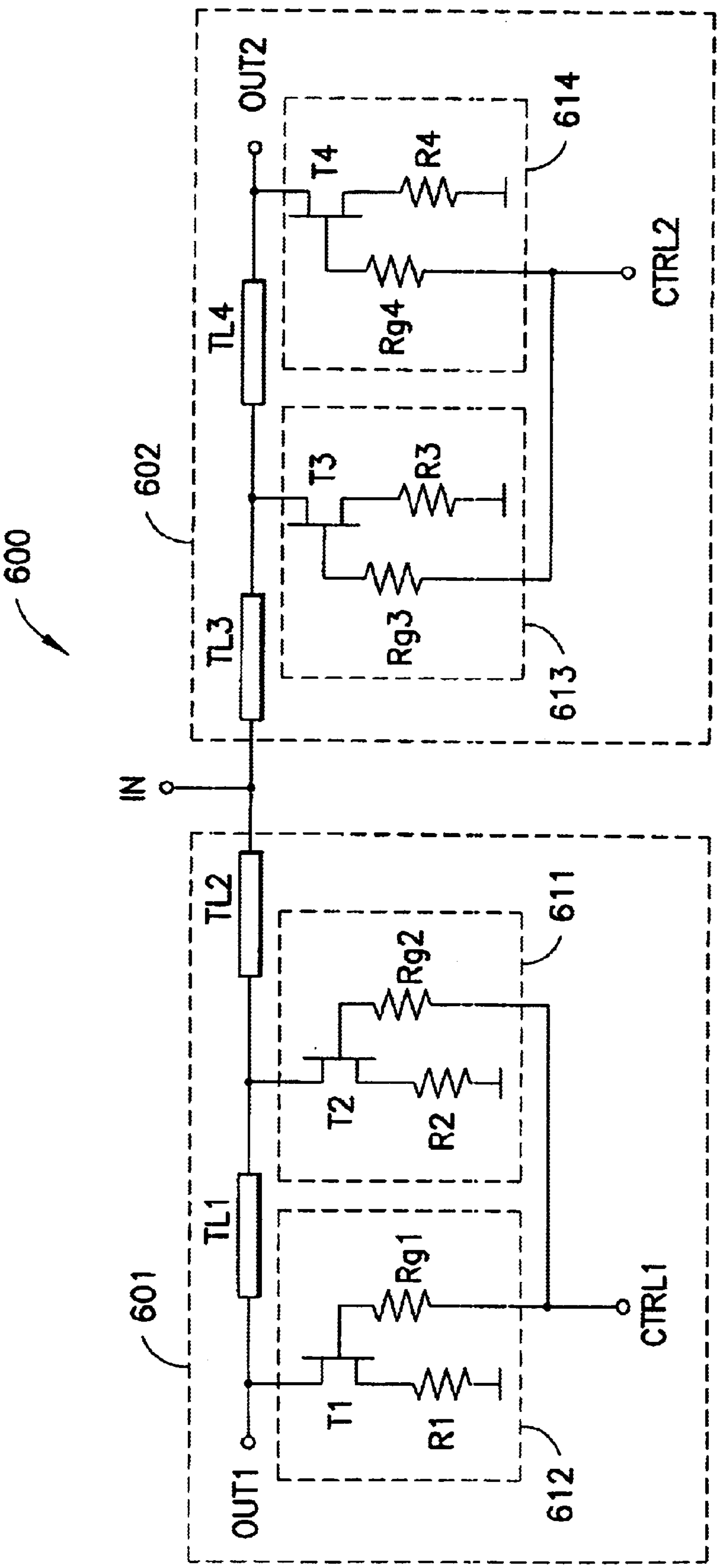
FIG. 6 is a schematic diagram of a non-reflective switch circuit according to an embodiment of the present invention.

The inventive circuit may also be used in a switch circuit such as the non-reflective switch circuit 600 of FIG. 6. The switch circuit 600 includes an input terminal IN and first and second output terminals OUT1 and OUT2. A first switch circuit 601 is connected between the input terminal IN and the first output terminal OUT1 and a second switch circuit 602 is connected between the input terminal and the second output terminal OUT2. The first switch circuit 601 includes two transmission lines TL1, TL2 connected between the input terminal IN and the first output terminal OUT1 and two variable shunt elements 611, 612 connected to ground. The first variable shunt element 611 is connected between the two transmission lines and the second variable shunt element 612 is connected to the first output terminal OUT1. The control signal CTRL1 controls the switch 601. The second switch circuit 602 is a mirror image of the first switch circuit 601 and includes transmission lines TL3 and TL4 and variable shunt elements 613, 614.

When the switch circuit 600 is intended to switch the RF-signal at the input terminal IN to the first output terminal OUT1, the variable shunt elements 611, 612 of the first switch circuit 601 are controlled by control signal CTRL1 to a high resistance state and the variable shunt element 613, 614 of the second switch circuit 602 are controlled by control signal CTRL2 to a low resistance state. In this operating state, the impedance of the variable shunt element 613 at the contact node between the transmission lines TL3 and TL4 is close to zero. The transmission line TL3 introduces an impedance in parallel with the first switch circuit so that the impedance seen from the input terminal IN is within the operable range, i.e., at the output impedance of the circuit connected to the input terminal, thereby preventing reflective losses. When the signal is to be switched to the second output terminal OUT2, the control signals CTRL1 and CTRL2 are controlled to the opposite states.

Figure 7A:
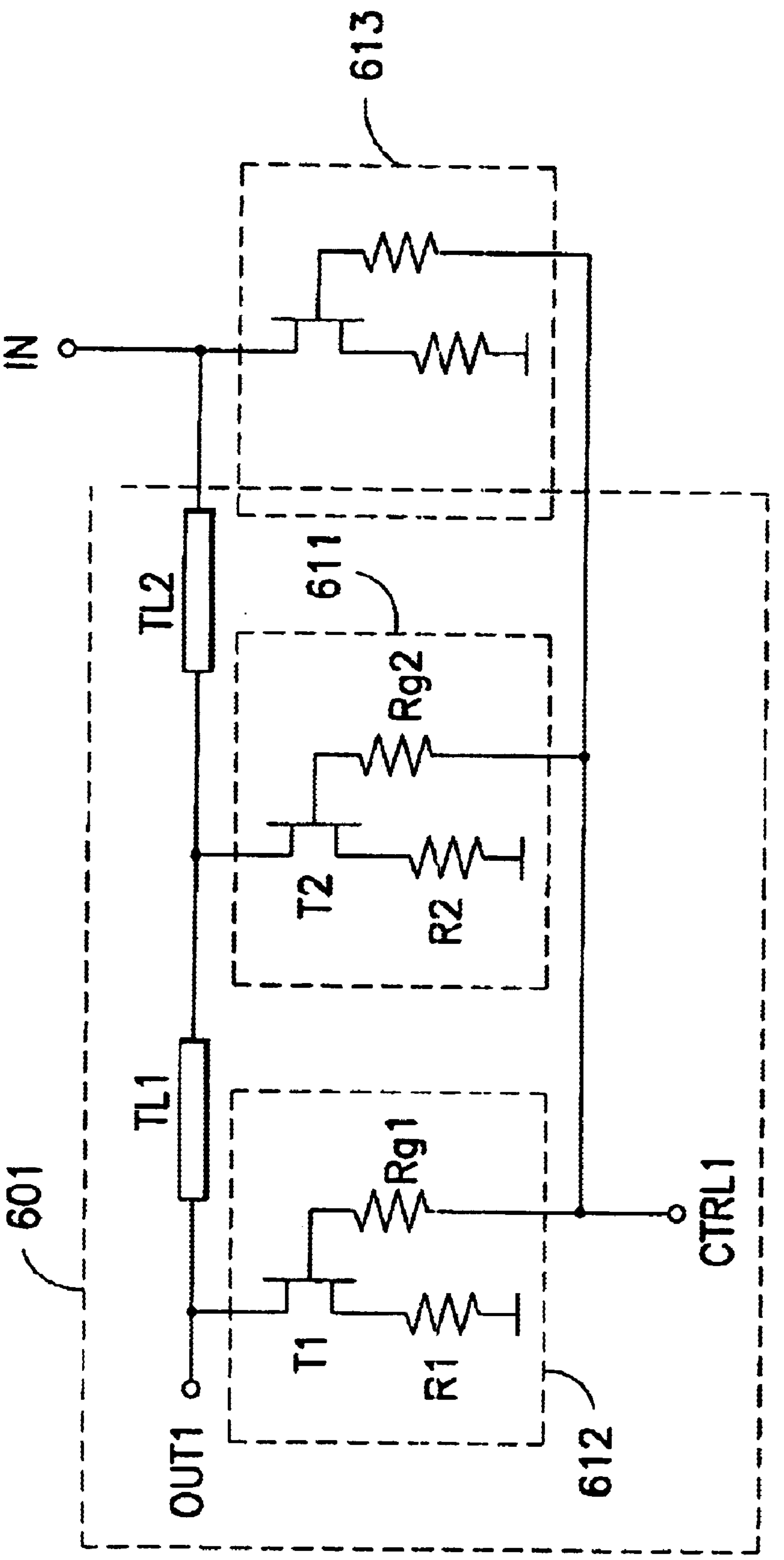
FIGS. 7A and 7B are schematic diagrams of non-reflective switch circuits respectively showing a single pole single throw switch and a single pole triple throw switch.
Figure 7B:
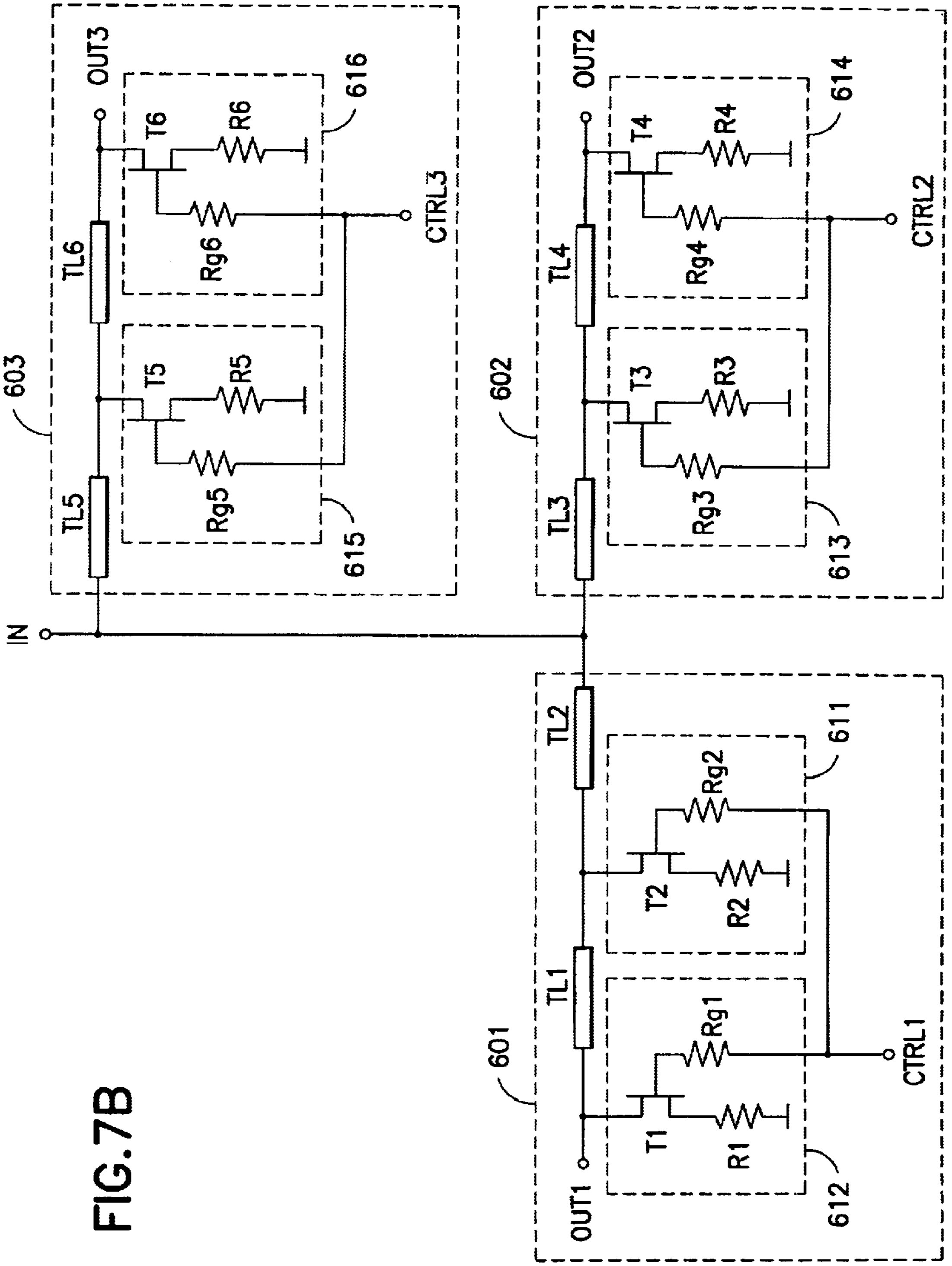

The circuit topology of the non-reflective switch circuit 600 may also be used for a single pole single throw switch which has only one switch circuit (see FIG. 7A) and a single pole triple throw switch which has three switch circuits (see FIG. 7B). The single pole single throw circuit includes only the first switch circuit 601 of FIG. 6. The single pole triple throw includes both the first and second switch circuits 601, 602 of FIG. 6 and a third switch circuit 603 arranged between the input terminal IN and a third output terminal OUT3. The third switch circuit 603 includes variable shunt elements 615, 616 and transmission lines TL5 and TL6. The variable shunt elements 615, 616 are controlled by a third control signal CTRL3.

The single pole single throw circuit of FIG. 7A may optionally include a third shunt circuit 613 for helping maintain the impedance of the switch circuit within the operable range. Since the switch circuit 601 in FIG. 7A is not connected in parallel with other circuits, the impedance of the transmission lines TL2 may not be adequate for maintaining the impedance of the circuit within the operable range. In the switch circuits of FIGS. 6 and 7B, there is always one switch circuit that is in the non-attenuating state. This helps maintain the impedance at the input within the operable range.

Thus, while there have shown and described and pointed out fundamental novel features of the invention as applied to preferred embodiments thereof, it will be understood that various omissions and substitutions and changes in the form and details of the devices illustrated, and in their operation, may be made by those skilled in the art without departing from the spirit of the invention. For example, it is expressly intended that all combinations of those elements which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A circuit for attenuating radio frequency signals, comprising:

- an input terminal;
- an output terminal; and
- a first attenuation circuit connected between said input terminal and said output terminal, said first attenuation circuit comprising:
  - a first transmission line connected in series between said input terminal and said output terminal and having a first transmission line impedance;
  - a first variable shunt element having one leg connected at a point between said first transmission line and said input terminal, said first variable shunt element having a variable impedance;
  - a second variable shunt element having one leg connected at a point between said first transmission line and said output terminal, said second variable shunt element having a variable impedance; and
  - a control signal terminal connected to each of said first and second variable shunt elements so that an attenuation level of said first attenuation circuit is controllable by a control signal input to said control signal terminal, said first transmission impedance and said variable impedances of said first and second variable shunt elements being selected so that an impedance level at said input terminal is within an operable range for all attenuation levels of said first attenuation circuit.

2. The circuit of claim 1, wherein said transmission line comprises an inductive transmission line and said variable impedances of said first and second variable shunt elements includes a capacitance.

3. The circuit of claim 1, wherein each of said first and second variable shunt elements comprises a transistor.

4. The circuit of claim 3, wherein at least one of said first and second variable shunt elements comprises a plurality of transistors connected in series.

5. The circuit of claim 1, further comprising a second attenuation circuit connected in series with said first attenuation circuit between said input terminal and said output terminal, said second attenuation circuit comprising:

a second transmission line having a second transmission line impedance and connected in series between said first attenuation circuit and said output terminal;

a third variable shunt element having a leg connected at a point between said first attenuation circuit and said second transmission line, said third variable shunt element having a variable impedance;

a fourth variable shunt element having a leg connected at a point between said second transmission line and said output terminal, said fourth variable shunt element having a variable impedance; and a second control signal terminal connected to said third and fourth variable shunt elements such that a level of attenuation of said second attenuation circuit is controlled by a control signal input to said second control signal terminal.

6. The circuit of claim 5, wherein said control signal input to said second control signal terminal of said second attenuation circuit is separate from said control signal input to said control signal terminal of said first attenuation circuit.

7. The circuit of claim 5, wherein said control signal input to said second control signal terminal of said second attenuation circuit is the same as said control signal input to said control signal terminal of said first attenuation circuit.

8. The circuit of claim 5, wherein said first and second transmission impedances and said impedances of said first, second, third, and fourth variable shunt elements are selected so that the impedance level at said input terminal of said circuit remains in the operable range for each attenuation level of said first and second attenuation circuits.

9. The circuit of claim 5, wherein each of said first, second, third, and fourth variable shunt elements comprises a transistor.

10. The circuit of claim 5, wherein an attenuation factor of said first attenuation circuit is different than an attenuation factor of said second attenuation circuit.

11. The circuit of claim 6, wherein said first and second transmission impedances and said impedances of said first, second, third, and fourth variable shunt elements are selected so that the impedance level of each of said first and second attenuation circuits is in the operable range for all attenuation levels of said first and second attenuation circuits.

12. The circuit of claim 1, wherein an attenuation level of said first attenuation circuit is controlled by only said control signal input to said control signal terminal connected to said first and second shunt elements.

13. The circuit of claim 1, further comprising at least one additional circuit portion connected between said second variable shunt element and said output terminal, each of said at least one additional circuit portion comprising an additional transmission line connected in series with said first transmission line and an additional shunt element having a leg connected at a point between said additional transmission line and said output terminal.

14. The circuit of claim 1, wherein said operable range of said impedance level at said input terminal comprises a range of impedances that exhibit a return loss of at least 10 dB with a nominal impedance level.

15. The circuit of claim 1, wherein the radio frequency signals to be attenuated have a frequency of at least 100 MHz.

16. An attenuator circuit for attenuating radio frequency signals, comprising:

an input terminal;

an output terminal; and a plurality of attenuation stages connected in series between said input terminal and said output terminal, each of said plural attenuation stages comprising:

a transmission line connected in series between said input terminal and said output terminal and having a transmission impedance;

a first variable shunt element having a leg connected at a point between said transmission line and said input terminal, said first variable shunt element having a variable shunt impedance;

a second variable shunt element having a leg connected at a point between said transmission line and said output terminal, said second variable shunt element having a variable shunt impedance; and a control signal terminal connected to each of said first and second variable shunt elements such that an attenuation level of said each of said plural attenuation stages is controllable by a control signal input to said control signal terminal, said transmission impedance and said variable shunt impedances being selected such that an impedance level at said input terminal is maintained in an operable range for all attenuation levels.

17. The attenuator circuit of claim 16, wherein said transmission line of each of said attenuation stages comprises an inductive transmission line and said impedances of said first and second variable shunt elements of each of said attenuation stages comprises a capacitance.

18. The attenuator circuit of claim 16, wherein said plural attenuator stages comprise three attenuation stages.

19. The attenuator circuit of claim 18, wherein each of said three attenuation stages has an attenuation factor different than the others of said three attenuation stages.

20. The attenuator circuit of claim 16, wherein each of said first and second variable shunt elements of each of said plural attenuator stages comprises a transistor.

21. The attenuation circuit of claim 20, wherein at least one of said first and second variable shunt elements of each of said plural attenuator stages comprises a plurality of transistors connected in series.

22. The attenuation circuit of claim 16, wherein each of said plural attenuation stages is independently selectively operable in one of a fully on state and a fully off state for effecting various levels of attenuation of said attenuation circuit.

23. The attenuation circuit of claim 16, wherein an attenuation level of said each of said plural attenuation stages is controllable by only said control signal input to said control signal terminal.

24. The attenuation circuit of claim 16, wherein said operable range of said impedance level at said input terminal comprises a range of impedances that exhibit a return loss of at least 10 dB with a nominal impedance level.

25. The circuit of claim 16, wherein the radio frequency signals to be attenuated have a frequency of at least 100 MHz.

26. The circuit of claim 2, wherein said control signal is connected as an input to a gate of each of said transistors in said first and second variable shunt elements.

* * * * *